(12) United States Patent
Brody et al.

(10) Patent No.: US 7,302,757 B2
(45) Date of Patent: Dec. 4, 2007

(54) MICRO-BUMPS TO ENHANCE LGA INTERCONNECTIONS

(75) Inventors: Jeffrey A. Brody, Hopewell Junction, NY (US); Hsichang Liu, Fishkill, NY (US); Hai Pham Longworth, Poughkeepsie, NY (US); James C. Monaco, Stormville, NY (US); Gerard J. Nuzback, Hopewell Junction, NY (US); Wei Zou, Wappingers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 49 days.

(21) Appl. No.: 11/204,699

(22) Filed: Aug. 16, 2005

(65) Prior Publication Data

US 2006/0030170 A1 Feb. 9, 2006

Related U.S. Application Data

(62) Division of application No. 10/708,887, filed on Mar. 30, 2004, now abandoned.

(51) Int. Cl.
*H01K 3/10* (2006.01)
(52) U.S. Cl. .............................. 29/852; 29/825; 29/846

(58) Field of Classification Search .................. 29/825, 29/846, 852
See application file for complete search history.

(56) References Cited

U.S. PATENT DOCUMENTS

| 4,116,517 A | * | 9/1978 | Selvin et al. ................. 439/67 |
| 5,591,037 A | | 1/1997 | Jin et al. |
| 5,931,685 A | * | 8/1999 | Hembree et al. ............. 439/74 |
| 6,088,236 A | | 7/2000 | Tomura et al. |
| 6,399,896 B1 | | 6/2002 | Downes, Jr. et al. |
| 6,641,406 B1 | * | 11/2003 | Yatskov et al. ............... 439/55 |

FOREIGN PATENT DOCUMENTS

| JP | 9-199851 | * | 7/1997 |
| JP | 11233674 A | * | 8/1999 |

* cited by examiner

*Primary Examiner*—Carl J. Arbes
(74) *Attorney, Agent, or Firm*—Kerry B. Goodwin

(57) ABSTRACT

An improved Land Grid Array interconnect structure is provided with the use of small metal bumps on the substrate electrical contact pad. The bumps interlock with segments of the fuzz button connection and increase the physical contact surface area between the contact pad and fuss button. The improved contact reduces displacement of electrical contact points due to thermo-mechanical stress and lowers the required actuation force during assembly.

10 Claims, 9 Drawing Sheets

MICRO-BUMPS TO ENHANCE LGA INTERCONNECTIONS

RELATED APPLICATION

This application is a divisional of U.S. application Ser. No. 10/708,887, filed on Mar. 30, 2004 now abandoned.

BACKGROUND OF THE INVENTION

The present invention is directed to electronic packaging, and more particularly, to Land Grid Array interconnections.

The term Land Grid Array (LGA) refers to a design option used by device manufacturers to package their devices without any terminations, such as solder balls, on the bottom of the chip carrier substrate. In order for LGA devices to electrically connect to a circuit board there is an intermediate device with contacts known as "fuzz buttons". Fuzz buttons are commonly manufactured from a single strand of wire and compressed into a cylindrical shaped bundle. The fuzz buttons are inserted between the contact pads on the bottom of the chip carrier substrate and their corresponding contact pads on the circuit board. When the chip carrier is forced against the circuit board, the fuzz-buttons compress between the respective contact pads to form the electrical connection.

Land grid array connections are typically used in high-end applications such as the substrate-to-board attach of high input-output (I/O) count packages. A high I/O count package will contain chip carriers with many contact pads. As RF frequencies, current densities, and I/O counts increase, while chip carrier substrate size and pitch continue to decrease, LGA connections are becoming more commonly used across a broad range of applications.

The fuzz button contact is made by randomly winding wire, typically gold plated molybdenum or tungsten, into a cylindrical bundle or "button". The fuzz buttons are typically loaded into a custom molded insulator or interposer configured to the geometry and pitch of the desired application. In other words, the fuzz buttons will coincide with the chip carrier and circuit board contact pads. In this way the fuzz buttons provide the electrical contact between chip carrier and circuit board. This configuration is commonly referred to as an "LGA socket".

Two major difficulties in manufacturing the current LGA modules are achieving the proper chip carrier substrate contact pad coplanarity (flatness) and controlling the variations with fuzz button contact characteristics such as height and textures of wire webbing. These characteristics are essential to ensure that adequate electrical contacts are made and reliably maintained. The current LGA contact pad is basically flat with no topography. The disadvantages of flat contact pads are the requirement of an excellent chip carrier substrate coplanarity or flatness which results in production yield loss.

Another problem with LGA modules is the requirement of a significant external actuation force to achieve a good electrical contact between chip carrier substrate contact pads, fuzz buttons and circuit board contact pads for the second level packaging. This high external actuation force may cause chip carrier substrate cracks and stress induced corrosion cracks. Another problem with LGA modules is the need for additional fixtures to enhance the electrical contact and prevent the loss of alignment or "walking" of the fuzz buttons and interposer due to the lack of mechanical interlocking between contact pads and fuzz buttons.

The present invention is to use micro-bumps with controlled geometry, topography and distributions on the contact pad to resolve the above problems. The manufacturing process of producing the disclosed micro-bumps on the contact pads is also disclosed. More particularly, the present invention provides a controlled surface topography on Input-Output (I/O) metal pads on the Land Grid Array (LGA) of microelectronic packages. The result is to enhance the surface areas of contact between the I/O pads in LGA substrates and the fuzz buttons in the interposer.

Thus, a purpose of the present invention is to build micro-bumps on substrate I/O contact pads to improve the physical LGA contact area.

Another purpose of the present invention is to provide mechanical inter-locking between the fuzz-button and contact pad and thereby reduce the displacement of electrical contact points during thermal excursions.

Another purpose of the present invention is to reduce the required actuation force.

These and other purposes of the present invention will become more apparent after referring to the following description considered in conjunction with the accompanying drawings.

BRIEF SUMMARY OF THE INVENTION

The present invention provides an electrical contact pad comprising a conductive contact pad, and at least one micro-bump on the contact pad.

The present invention also provides a Land Grid Array (LGA) structure comprising a chip carrier, bottom surface contact pads on a bottom surface of the chip carrier, and micro-bumps on the bottom surface contact pads. The LGA structure may further comprise a circuit board having circuit board contact pads, and fuzz buttons disposed between and in contact with the chip carrier bottom surface contact pads and the circuit board contact pads. The LGA structure may further comprise an interposer holding the fuzz buttons and configured to the geometry and pitch of the chip carrier bottom surface contact pads and the circuit board contact pads.

The present invention also provides a method for creating micro-bumps on metal contact pads comprising the steps of providing a plurality of glass ceramic greensheets, stacking the plurality of glass ceramic greensheets, the stack of glass ceramic greensheets having a bottom surface glass ceramic greensheet layer containing bottom surface metal contact pads, providing an alumina contact sheet having through holes, the through holes configured to the location and pitch of the desired micro-bumps, placing the alumina contact sheet in contact with the bottom surface glass ceramic greensheet layer such that the through holes coincide with the bottom surface metal contact pads, laminating the stack of glass ceramic greensheets and contact sheet to create a laminate and form micro-bumps on the bottom surface metal contact pads by extrusion of metal on the bottom surface metal contact pads into the through holes.

The method may further comprise the steps of sintering the laminate to form a glass ceramic chip carrier, and removing the contact sheet from the ceramic chip carrier thereby exposing the micro-bumps on the bottom surface metal contact pads.

The present invention also provides a method for creating micro-bumps on metal contact pads comprising the steps of providing a plurality of alumina ceramic greensheets, stacking the plurality of alumina ceramic greensheets, the stack of alumina ceramic greensheets having a bottom surface alumina ceramic greensheet layer containing bottom surface metal contact pads, providing a metal plate having through holes, the through holes configured to the location and pitch of the desired micro-bumps, placing the metal plate in contact with the bottom surface alumina ceramic greensheet layer such that the through holes coincide with the bottom surface metal contact pads, laminating the stack of alumina ceramic greensheets and metal plate to create a laminate and form micro-bumps on the bottom surface metal contact pads by extrusion of metal on the bottom surface metal contact pads into the through holes.

The method may further comprise the steps of removing the metal plate from the alumina ceramic chip carrier thereby exposing the micro-bumps on the bottom surface metal contact pads and then sintering the laminate to form an alumina ceramic chip carrier.

BRIEF DESCRIPTION OF THE DRAWINGS

The features of the invention believed to be novel and the elements characteristic of the invention are set forth with particularity in the appended claims. The Figures are for illustration purposes only and are not drawn to scale. The invention itself, however, both as to organization and method of operation, may best be understood by reference to the detailed description which follows taken in conjunction with the accompanying drawings in which:

DETAILED DESCRIPTION OF THE INVENTION

The purposes of the present invention have been achieved by providing, according to the present invention, a controlled and designed geometry and topography of the I/O pad metallurgy.

Figure 1A:
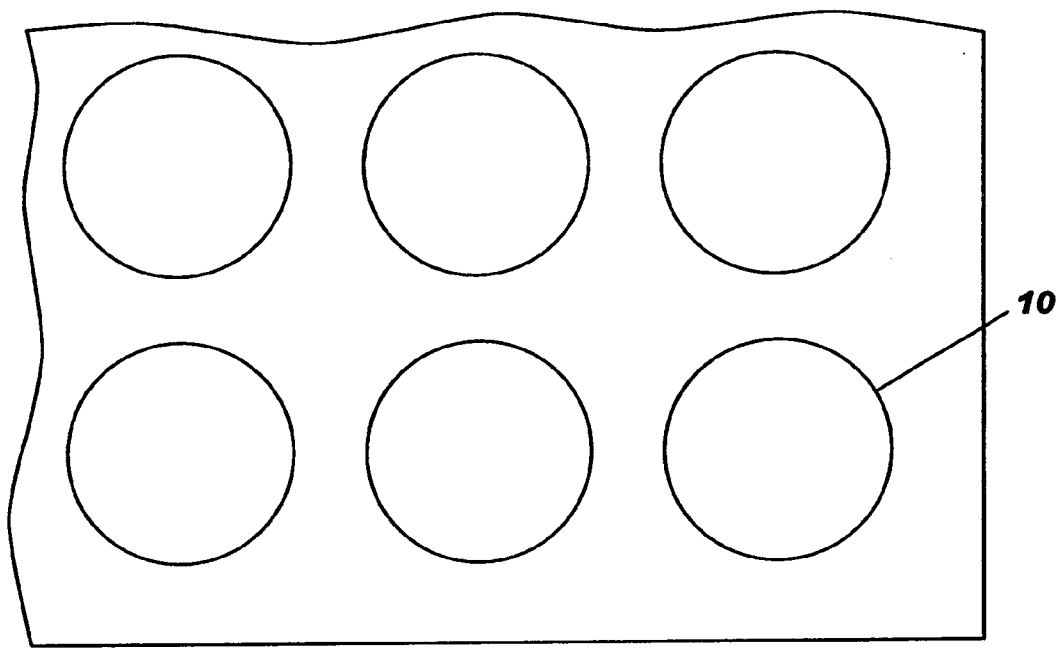
FIG. 1a-b is a top view of typical chip carrier contact pads.
Figure 1B:
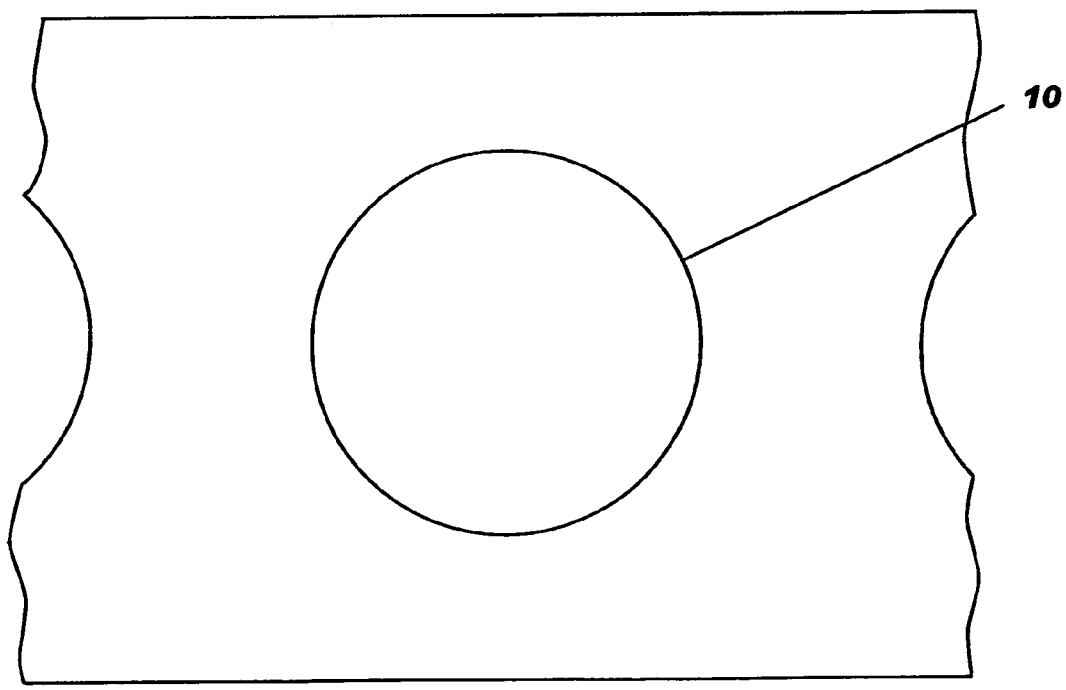
Figure 2A:
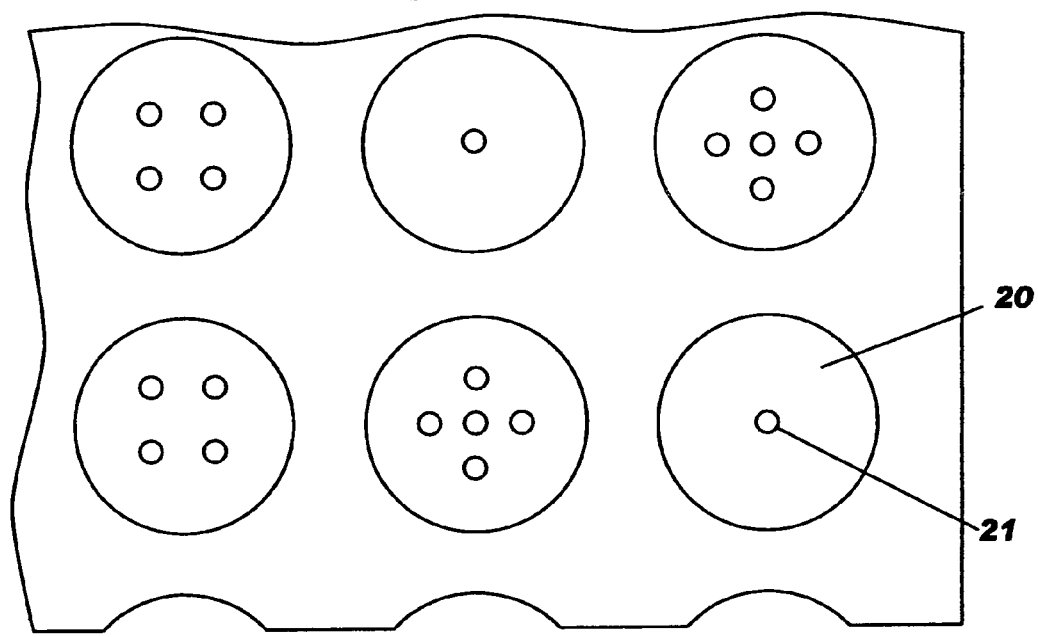
FIG. 2a-b is a top view of chip carrier contact pads with micro-bumps according to the present invention.
Figure 2B:
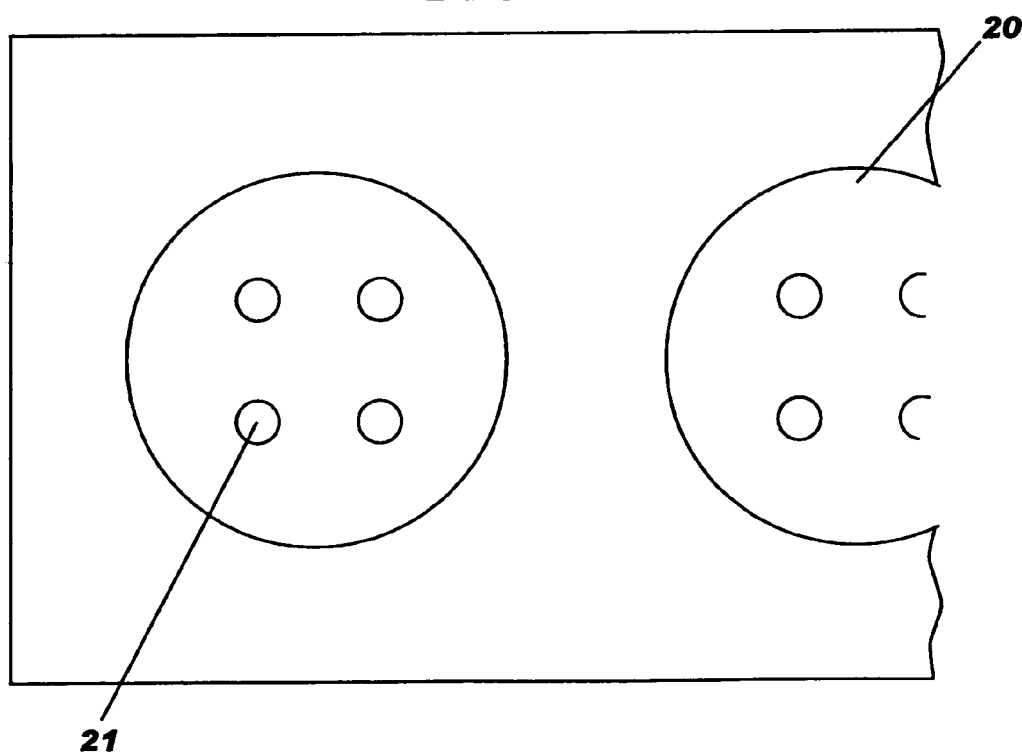

A first aspect of the present invention is to provide a controlled surface topography of metal micro-bumps on chip carrier metal contact pads. Referring to FIG. 1a there is shown a top view of a typical array of metal bottom surface chip carrier contact pads 10. A single bottom surface chip carrier metal contact pad 10 is shown in FIG. 1b. Referring now to FIG. 2a and FIG. 2b there is shown a top view of an array of metal bottom surface contact pads 20 according to the present invention. These metal contact pads 20 contain at least one micro-bump 21. FIG. 2a shows several pads with a different number and size of micro-bumps. The number and size of the micro-bumps can vary depending on the application.

The controlled surface topography of the present invention may have at least one or several micro-bumps on a metal contact pad. The number and dimensions of the micro-bumps are optimized for the most desirable topography on a particular contact pad diameter. In a preferred embodiment the micro-bumps are circular metal bumps, with base diameter ranging from approximately 100 um to 250 um with height ranging from approximately 30 um to 50 um. In a preferred embodiment a plurality of micro-bumps are uniformly and symmetrically distributed on the contact pad. In a preferred embodiment the diameter and height of the micro-bumps are relatively uniform, with a variation of less than approximately 10 um.

Figure 3A:
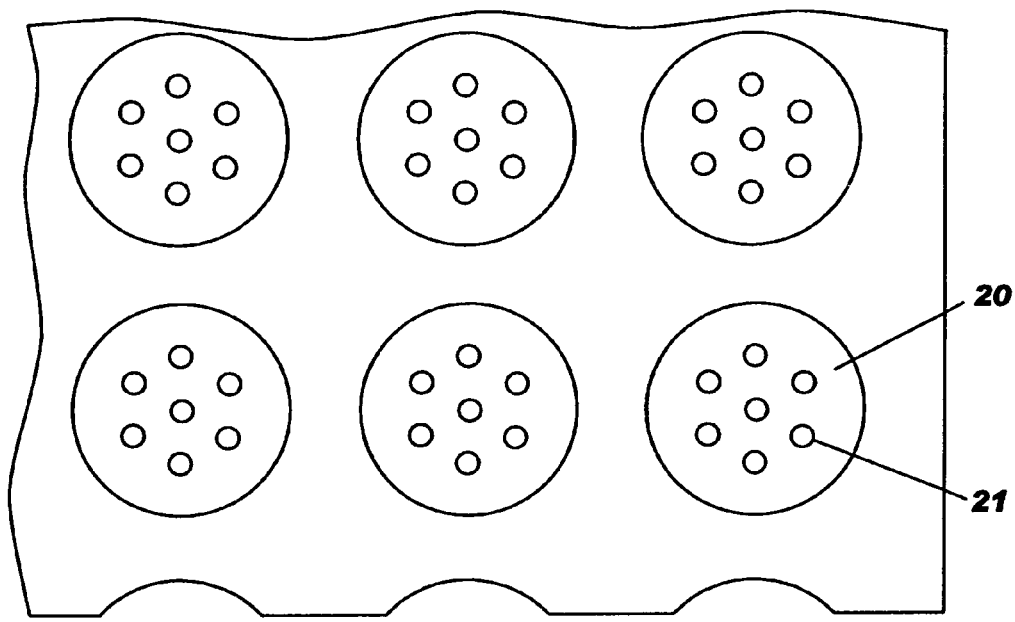
FIG. 3a-b is a top view of a preferred embodiment of the present invention.
Figure 3B:
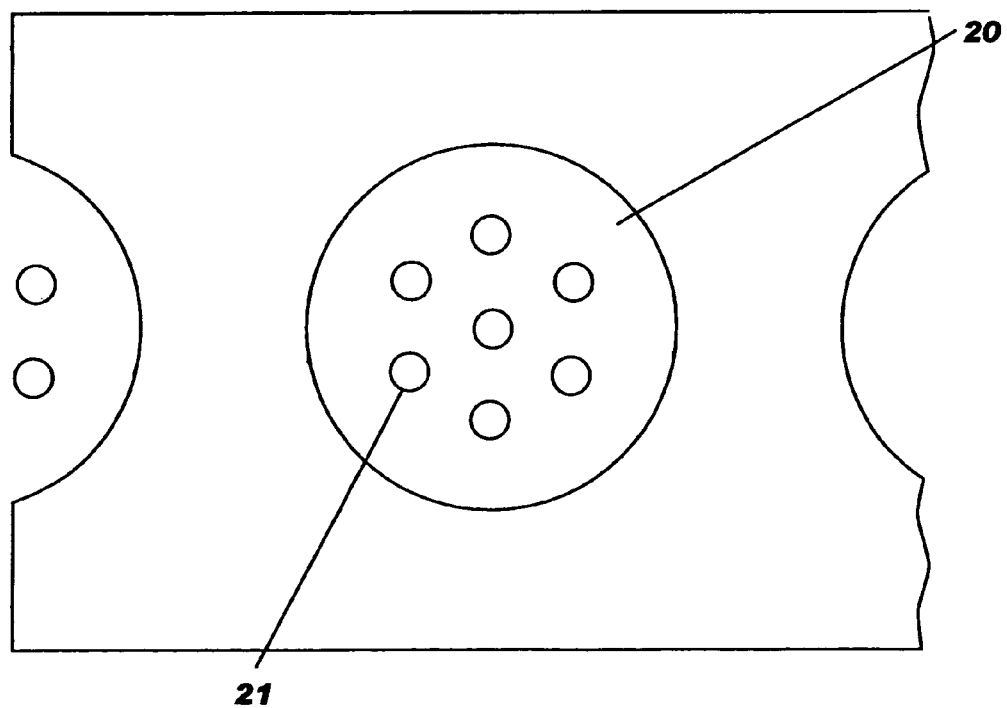
Figure 4:
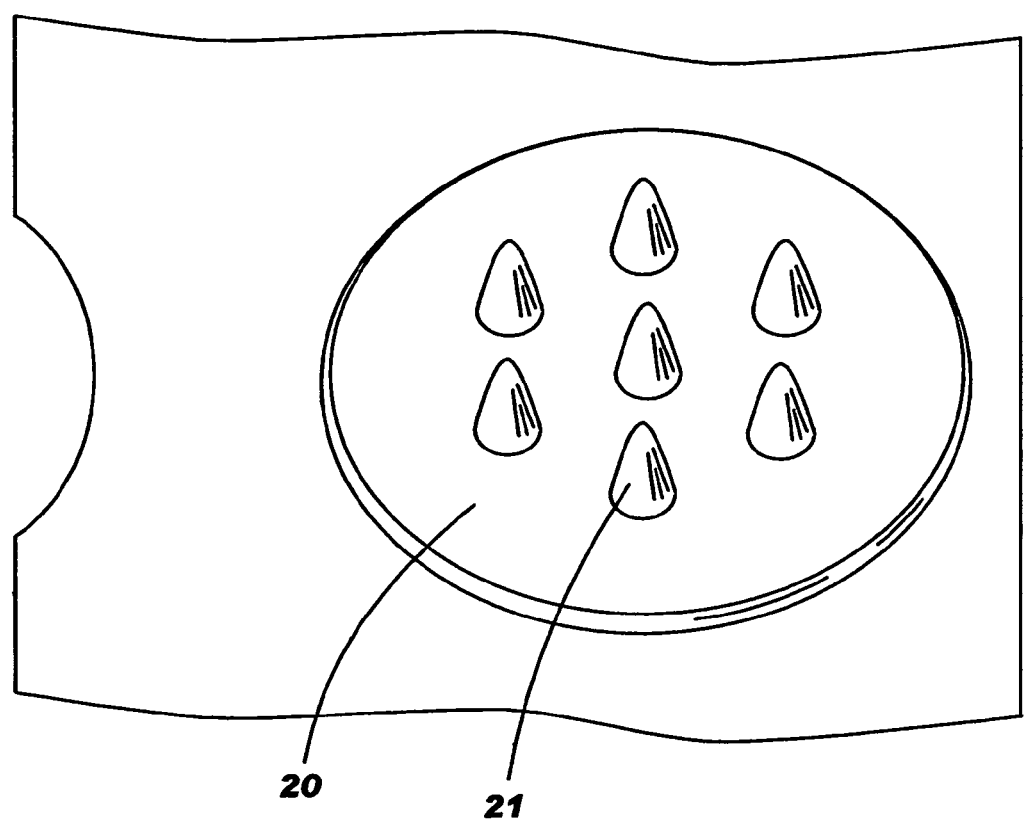
FIG. 4 is a perspective view of a preferred embodiment.
Figure 5:
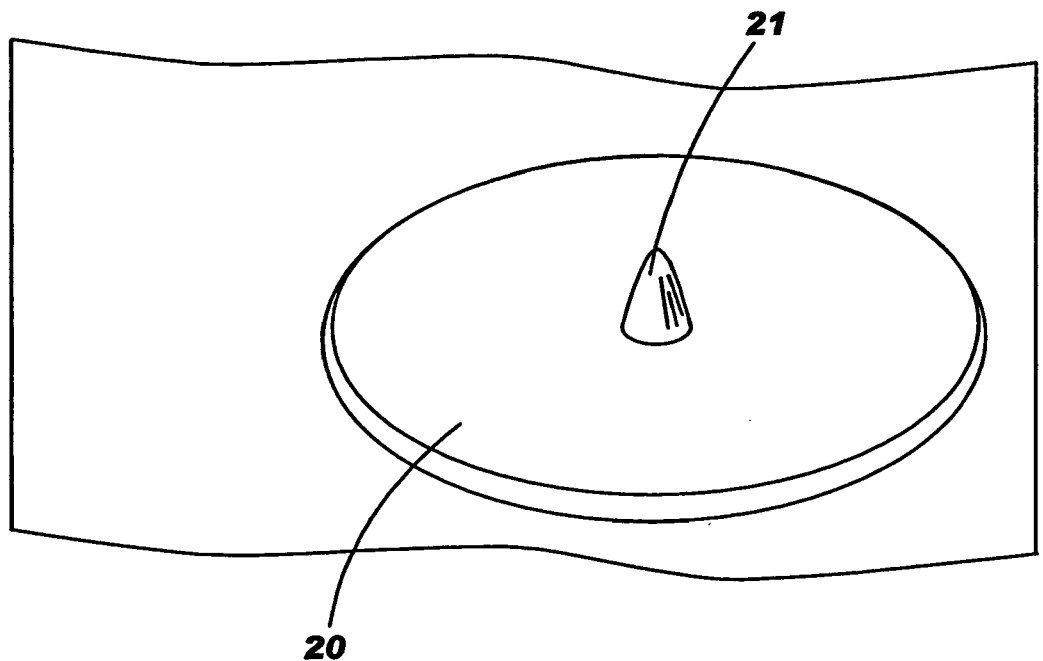
FIG. 5 is a perspective view of a chip carrier pad with a single micro-bump.

A preferred embodiment where all the metal contact pads 20 in the array have 7 micro-bumps 21 is shown in FIGS. 3a and 3b. The number of metal contact pads having micro-bumps and the number of micro-bumps on a metal contact pad may vary. The optimum number will vary depending on the particular application. In all applications the micro-bumps will improve and increase the surface contact area and mechanical stability between metal contact pads and fuzz buttons in LGA assemblies. Referring to FIGS. 4 and 5 there is shown perspective views of various embodiments of metal contact pads 20 with micro-bumps 21 according to the present invention.

Figure 6A:
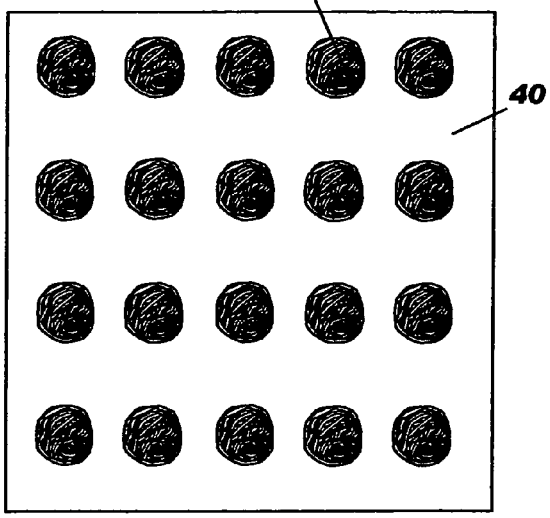
FIG. 6a-c are top views of typical fuzz button connectors.
Figure 6B:
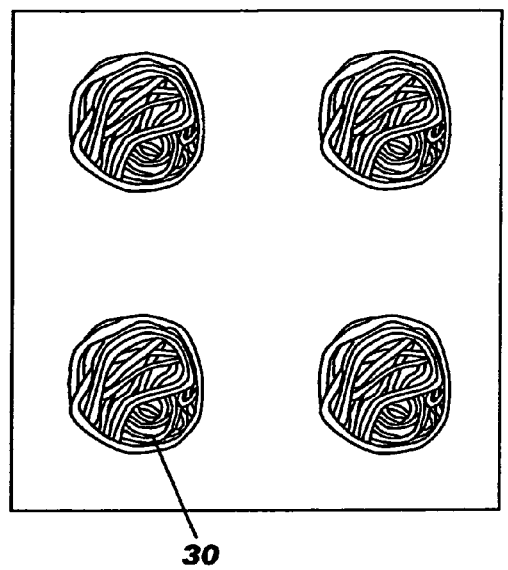
Figure 6C:
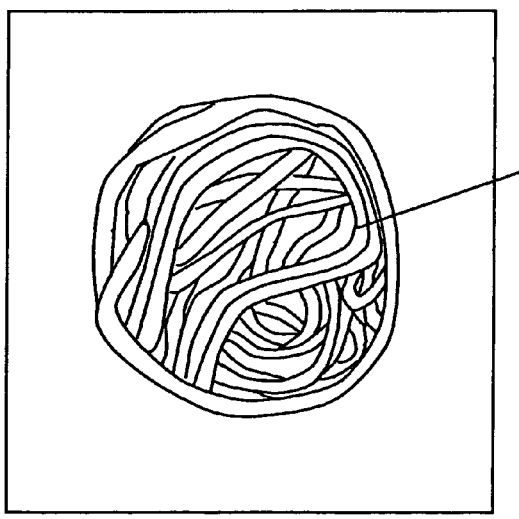

FIG. 6a is a top view of an array of fuzz buttons 30 held in an interposer 40. As shown more clearly in FIGS. 6b and 6c, the fuzz button 30, as discussed above, is made of a web of conductive wire to provide the interconnections between the metal contact pads on a chip carrier and metal pads on a printed circuit board.

Figure 7A:
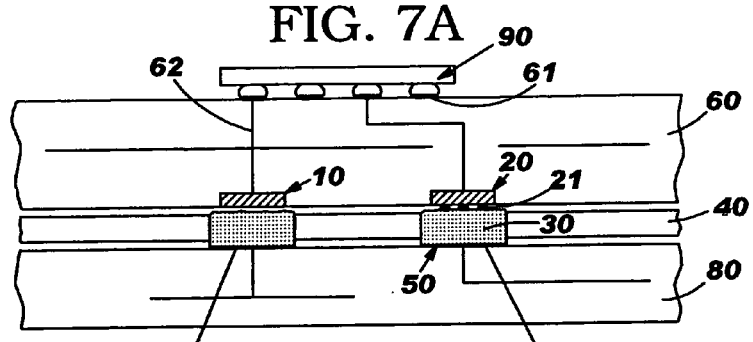
FIG. 7a-e is a cross sectional view of a module assembly incorporating the present invention.

Referring to FIG. 7a there is shown a cross section view of an electronic module with an LGA interconnection. A ceramic chip carrier 60 has top surface metal contact pads 61. A semiconductor chip 90 is soldered to the top surface metal contact pads 61 and internal wiring connections 62 connect the chip 90 to bottom surface metal contact pads 10, 20. For convenience, FIG. 7a shows both the typical metal contact pad 10 and the metal contact pad 20 with bumps 21 according to the present invention. The interposer 40 holds the fuzz buttons 30 in alignment between the metal contact pads 10, 20 and metal contact pads 50 on a printed circuit board 80.

Figure 7B:
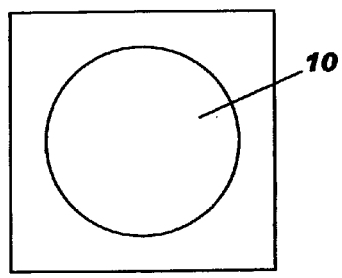
Figure 7C:
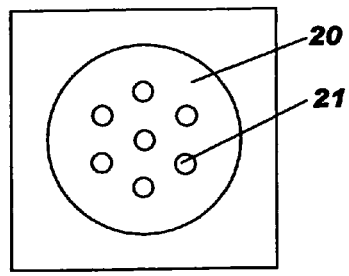
Figure 7D:
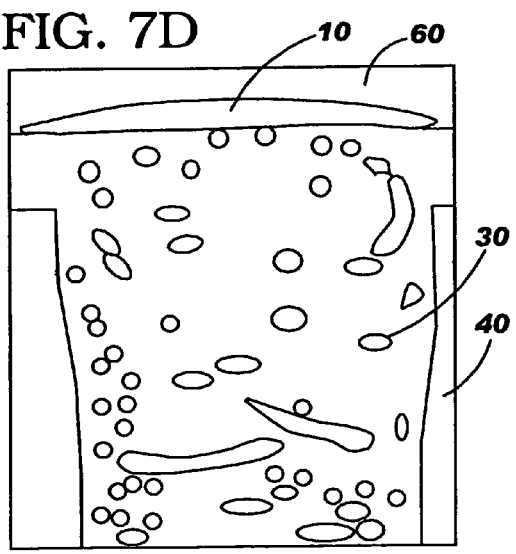
Figure 7E:
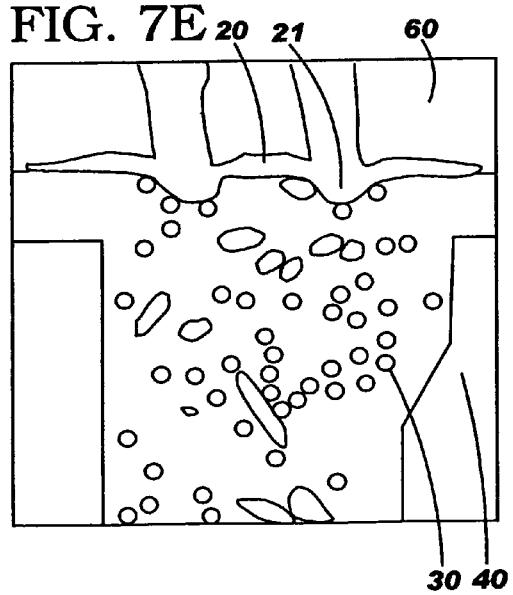

FIG. 7b is a top view of metal contact pad 10 and FIG. 7c is a top view of metal contact pad 20 with bumps 21 according to the present invention. FIGS. 7d and 7e are provided to illustrate the advantage of the present invention. FIG. 7d is a cross section of a typical LGA interconnection between a conventional bottom surface contact pad 10 and the fuzz button 30. In particular, it can be seen there is typically limited contact area between the fuzz button wire and pad.

FIG. 7e is a cross section of an LGA interconnection, according to the present invention, between the bottom surface contact pad 20 and bumps 21, and fuzz button 30. It can be seen that the bumps 21 increase and improve the surface contact area and mechanical stability between the metal contact pads 20 and fuzz button 30. The increased physical contact surface and mechanical inter-locks, due to the three-dimensional contacts between the bumped metal pads and fuzz button, results in a better electrical interconnection and improved reliability.

Figure 8:
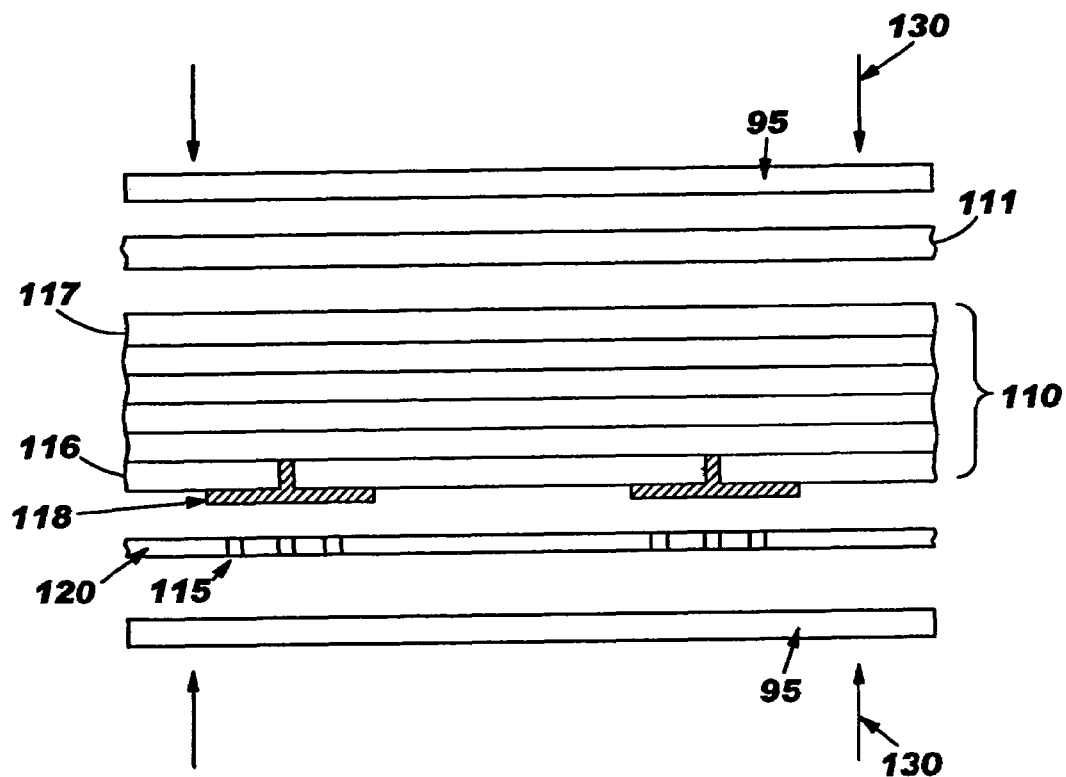
FIG. 8 is a schematic cross section of a layer assembly illustrating a first method of forming micro-bumps according to the present invention.

A method for providing metal contact pads 20 with bumps 21, according the present invention, is now described with reference to FIG. 8. In the manufacture of multi-layer ceramic (MLC) chip carrier substrates, unfired ceramic greensheets are personalized with via holes and conductive metal. A conductive paste is screened on the sheets to fill the vias and create wiring connections. The ceramic greensheets are then stacked together in a predetermined design sequence to form a green ceramic laminate. For glass ceramic greensheets 110 blank unpunched alumina contact sheets 111 are placed on the top and bottom ceramic greensheet layers to control feature distortion. After the greensheets are stacked, metal lamination plates 95, for example stainless steel, are used to apply heat and pressure to the greensheets 110 to provide a green ceramic laminate with continuous conductive metal wiring whose layers will remain contiguous during subsequent processing. This process of applying heat and pressure to the stacked greensheets is called lamination. The green ceramic laminate is then fired at high temperature in a process called sintering to densify the ceramic and conductive metal materials and create the ceramic chip carrier substrate.

In this embodiment of the present invention, metal micro-bumps will be created on un-fired copper (Cu) bottom surface contact pads 118 on a glass ceramic chip carrier comprised of glass ceramic layers 110. The micro-bumps are formed on the un-fired Cu metal pads 118 by the high pressure mechanical extrusion of the Cu paste and underlying glass ceramic materials into pre-punched holes through holes 115 in an alumina ($Al_2O_3$) contact sheet 120 during the high pressure lamination process. In conventional glass ceramic sintering, alumina contact sheets 111 without holes are placed on the top surface glass ceramic greensheet layer 117 and bottom surface glass ceramic greensheet layer 116 to help control feature distortion during sintering. The alumina contact sheets 111 are temporary and are removed from the chip carrier substrate after sintering.

In the present invention the conventional blank, un-punched bottom surface alumina contact sheet 111 is replaced with a pre-punched alumina contact sheet 120. After the substrate is sintered the pre-punched alumina contact sheet 120 is removed to reveal the micro-bumps on the pads. In a preferred embodiment the thickness of the pre-punched alumina contact sheet 120 is approximately 150 μm to 250 μm and the pre-punched holes are approximately 50 μm-300 μm in diameter. In a preferred embodiment the holes are punched in a symmetrical pattern, with 1 to 9 holes punched to coincide with each Cu metal pad. As illustrated in FIG. 8, the Cu metal pads 118, on the bottom layer 116 of the multi-layer stack of glass ceramic green sheets 110 are laminated in the un-fired or "green" state. This allows the extrusion of pad material into the pre-punched holes 115 in the alumina sheet 120 to form the micro-bumped Cu metal pads by the high pressure lamination force 130.

After the above stack and lamination process, the entire green glass ceramic laminate, including the top and bottom side alumina contact sheets, will be co-fired at high temperature to form the glass ceramic chip carrier. The pre-punched alumina sheet 120 is temporary and removed after sintering. The alumina contact sheet removal is a conventional process. In a preferred embodiment the alumina contact sheet is easily removed by a media blast or slurry to reveal the Cu micro-bumps on the contact pads. The bumped Cu pads are typically then plated with Ni and Au or Pd layers. In a preferred embodiment the final bumped contact pad will be comprised of copper, nickel and gold.

Another method for providing metal contact pads 20 with micro-bumps 21, according the present invention, is now described with reference to FIG. 9. In this embodiment of the present invention there is disclosed a method to provide bumped molybdenum (Mo) or tungsten (W) contact pads 140 on an alumina ceramic chip carrier comprised of alumina ceramic greensheet layers 150. In alumina sintering top and bottom alumina contact sheets are not required. In this embodiment, the micro-bumps are formed on the Mo or W bottom surface contact pads 140 by the high pressure mechanical extrusion of the Mo or W pads 140 into pre-drilled through holes 165 in a metal plate 160 to form micro-bumped Mo or W contact pads. In a preferred embodiment the metal plate 160 is a steel plate with a thickness of approximately 150 μm to 250 μm. In a preferred embodiment the metal plate 160 is pre-drilled in a symmetrical pattern with circular through holes approximately 50 μm to 300 μm in diameter.

Figure 9:
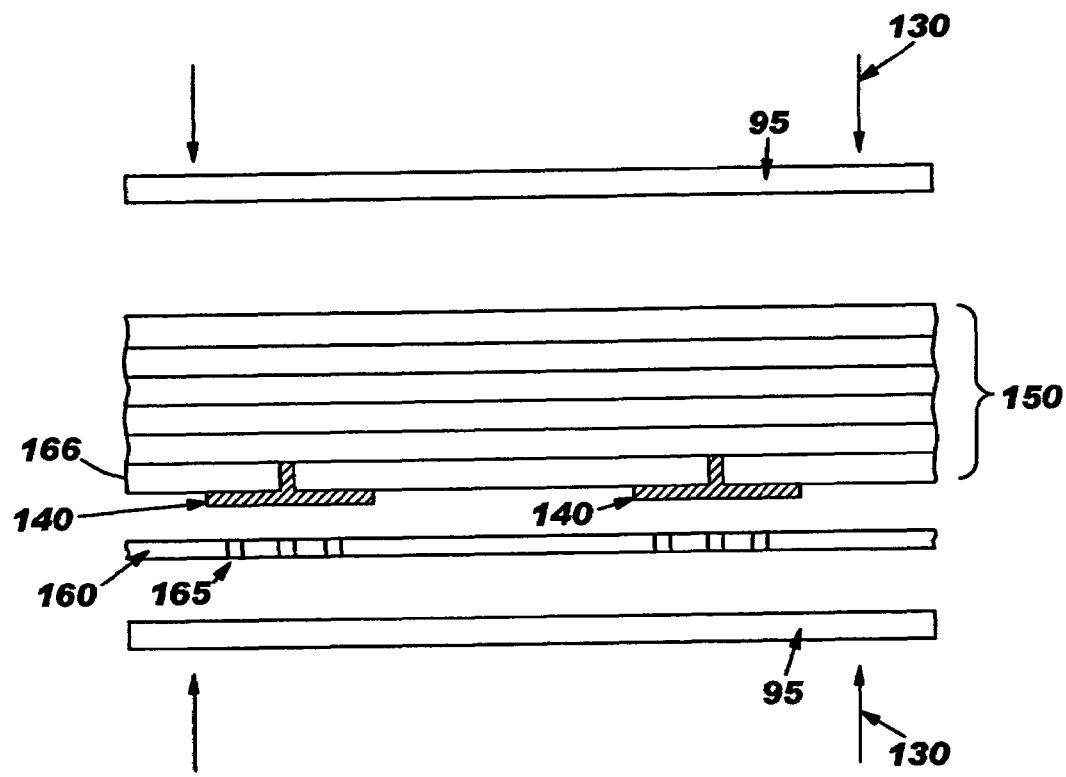
FIG. 9 is a schematic cross section of a layer assembly illustrating a second method of forming micro-bumps according to the present invention.

As illustrated in FIG. 9, the Mo or W contact pads 140, on the bottom surface alumina ceramic greensheet layer 166 of the multi-layer stack of alumina ceramic green sheets 150 while all sheets are, still in the un-fired or "green" state. This allows the extrusion into the pre-drilled through holes 165 in the metal plate 160 to form the micro-bumped Mo or W metal pads by the high pressure lamination force 130 exerted by the steel lamination plates 95. After the high pressure lamination process, but before sintering, the green alumina ceramic laminate having micro-bumped Mo or W pads is separated from the metal plate 165. The green laminate is then sintered or fired at high temperature to form a micro-bumped alumina ceramic chip carrier. The bumped Mo or W pads are typically then plated with Ni and Au or Pd layers. In a preferred embodiment the final bumped contact pad will be comprised of molybdenum, nickel and gold.

The present invention provides numerous advantages over the prior art. For a given coplanarity or flatness of chip carrier, the micro-bumps will enhance the physical contact surface areas, and thereby increase the integrity of electrical interconnections between I/O contact pads and fuzz buttons. The micro-bumps provide three-dimensional surface contact with the fuzz buttons which increases the fuzz button contact area to the I/O contact pad.

The interlocking of the micro-bumps and segments of fuzz button wires will reduce displacement of electrical contact points due to thermo-mechanical stresses under use conditions. The enhanced reliable contacts will further reduce the need for high actuation force. This will lower the external stress to the chip carrier during LGA actuation reduces or eliminates substrate stress corrosion crack (SCC) concern.

The improved contact also provides relief in bottom surface contact pad coplanarity requirements and therefore improves chip carrier yield. The height of the micro-bumps provides additional dimensions for fuzz buttons to contact with I/O contact pads. The micro-bumped pads allow a more relaxed chip carrier bottom surface contact pad coplanarity specification while still being capable of achieving the same amount of surface contact areas. This will improve the substrate sintering yield in bottom surface coplanarity.

The enhanced mechanical inter-locking will improve the uniformity and reliability of the interconnection. This will also reduce the concern about "walking" of fuzz buttons and interposer during stress (power-on operational conditions) and reduce the LGA module actuation rework due to insufficient fuzz button contact. The enhanced mechanical inter-locking will also allow for a reduction of the external compression stress to the chip carrier, which shall minimize the stress-corrosion-cracks (SCC) concern for the large sized LGA ceramic substrates.

It will be apparent to those skilled in the art having regard to this disclosure that other modifications of this invention beyond those embodiments specifically described here may be made without departing from the spirit of the invention.

The basic idea of using the above bumped metal pads, with the said geometry and dimensions, to enhance the electrical connections with the fuzz buttons in an interposer shall be applicable to other electronic units. Accordingly, such modifications are considered within the scope of the invention as limited solely by the appended claims.

What is claimed is:

1. A method for creating micro-bumps on metal contact pads comprising the steps of:

providing a plurality of glass ceramic greensheets, stacking said plurality of glass ceramic greensheets, said stack of glass ceramic greensheets having a bottom surface glass ceramic greensheet layer containing bottom surface metal contact pads, wherein the metal contact pads have an exterior surface extending beyond the bottom surface glass ceramic greensheet layer, providing an alumina contact sheet having through holes, said through holes configured to the location and pitch of the desired micro-bumps, placing said alumina contact sheet first in contact with said metal contact pad exterior surface and subsequently forcing the alumina contact sheet into contact with said bottom surface glass ceramic greensheet layer thereby extruding at least a portion of the metal contact pad into the through holes to form micro-bumps on the metal contact pad exterior surface, and laminating said stack of glass ceramic greensheets and contact sheet to create a laminate.

2. The method of claim 1 further comprising the steps of:

sintering said laminate to form a glass ceramic chip carrier, and removing said contact sheet from said glass ceramic chip carrier thereby exposing said micro-bumps on said bottom surface metal contact pads.

3. The method of claim 1 wherein said alumina contact sheet is pre-punched with circular through holes approximately 50 µm to 300 µm in diameter.

4. The method of claim 3 wherein said circular through holes are punched in a symmetrical pattern.

5. The method of claim 1 wherein said alumina contact sheet has a thickness of approximately 150 µm to 250 µm.

6. A method for creating micro-bumps on metal contact pads comprising the steps of:

providing a plurality of alumina ceramic greensheets, stacking said plurality of alumina ceramic greensheets, said stack of alumina ceramic greensheets having a bottom surface alumina ceramic greensheet layer containing bottom surface metal contact pads, wherein the metal contact pads have an exterior surface extending beyond the bottom surface alumina ceramic greensheet layer, providing a metal plate having through holes, said through holes configured to the location and pitch of the desired micro-bumps, placing said metal plate first in contact with said metal contact pad exterior surface and subsequently forcing the metal plate into contact with said bottom surface alumina ceramic greensheet layer thereby extruding at least a portion of the metal contact pad into the through holes to form micro-bumps on the metal contact pad exterior surface, and laminating said stack of alumina ceramic greensheets and metal plate to create a laminate.

7. The method of claim 6 further comprising the steps of:

removing said metal plate from said alumina ceramic chip carrier thereby exposing said micro-bumps on said bottom surface metal contact pads, and sintering said laminate to form an alumina ceramic chip carrier.

8. The method of claim 6 where said metal plate is pre-drilled with circular through holes approximately 50 µm to 300 µm in diameter.

9. The method of claim 7 where said circular through holes are punched in a symmetrical pattern.

10. The method of claim 6 where said metal plate has a thickness of approximately 150 µm to 250 µm.

* * * * *